(12) United States Patent
Ting et al.

(10) Patent No.: US 10,680,163 B2
(45) Date of Patent: Jun. 9, 2020

(54) PIEZOELECTRIC SENSING MODULE, PIEZOELECTRIC SENSING MODULE DETECTING METHOD, AND PIEZOELECTRIC SENSING DETECTION SYSTEM THEREOF

(71) Applicant: Chung-Yuan Christian University, Chung Li, Tao Yuan County (TW)

(72) Inventors: Yung Ting, Chung Li (TW); Sheuan-Perng Lin, Chung Li (TW); Suprapto, Chung Li (TW); Hsin-Yuan Chen, Chung Li (TW); Yuan-Yu Chou, Chung Li (TW)

(73) Assignee: CHUNG-YUAN CHRISTIAN UNIVERSITY, Chung Li, Tao Yuan County (TW)

( * ) Notice: Subject to any disclaimer, the term of this patent is extended or adjusted under 35 U.S.C. 154(b) by 22 days.

(21) Appl. No.: 16/136,649

(22) Filed: Sep. 20, 2018

(65) Prior Publication Data

US 2019/0312191 A1 Oct. 10, 2019

(30) Foreign Application Priority Data

Apr. 9, 2018 (TW) .............................. 107112130 A

(51) Int. Cl.
| | |
|---|---|
| *G01L 1/00* | (2006.01) |
| *H01L 41/113* | (2006.01) |
| *B23Q 17/09* | (2006.01) |
| *G01L 1/16* | (2006.01) |
| *H01L 41/047* | (2006.01) |

(52) U.S. Cl.
CPC ...... *H01L 41/1132* (2013.01); *B23Q 17/0966* (2013.01); *G01L 1/16* (2013.01); *H01L 41/047* (2013.01)

(58) Field of Classification Search
CPC ............... H01L 41/1132; H01L 41/047; B23Q 17/0966; G01L 1/16
USPC ........................................................... 73/777
See application file for complete search history.

(56) References Cited

U.S. PATENT DOCUMENTS 4,868,447 A * 9/1989 Lee ....................... H01L 41/047
310/328
6,346,764 B1 * 2/2002 Boyd .................... H01L 41/107
310/358

(Continued)

*Primary Examiner* — Max H Noori
(74) *Attorney, Agent, or Firm* — Muncy, Geissler, Olds & Lowe, P.C.

(57) ABSTRACT

A piezoelectric sensing module, a piezoelectric sensing module detecting method, and a piezoelectric sensing detection system thereof are disclosed. The piezoelectric sensing module is used for an operating tool. The piezoelectric sensing module includes a piezoelectric sensing film, and the piezoelectric sensing film includes at least a first to a sixth electrodes; wherein the first electrode is disposed between the third and the fourth electrodes, the second electrode is disposed between the fifth and the sixth electrodes; wherein the first and the second electrodes, the third and the fifth electrodes, and the fourth and the sixth electrodes are separated by a certain distance respectively, and a first angle between the first and the second electrodes, a second angle between the third and the fifth electrodes, and a third angle between the fourth and the sixth electrodes each have an included angle of 90 degrees.

19 Claims, 8 Drawing Sheets

(56) References Cited

U.S. PATENT DOCUMENTS

| | | | | |
|---|---|---|---|---|
| 8,115,367 B2* | 2/2012 | Iyoki | ............ | B82Y 35/00 |
| | | | | 310/365 |
| 2007/0170818 A1* | 7/2007 | Yoshioka | ............ | H01L 41/0471 |
| | | | | 310/328 |
| 2011/0128245 A1* | 6/2011 | Andoh | ............ | H01L 41/193 |
| | | | | 345/173 |
| 2014/0118445 A1* | 5/2014 | Ikeuchi | ............ | B41J 2/155 |
| | | | | 347/68 |
| 2018/0136771 A1* | 5/2018 | Ting | ............ | G01L 5/167 |
| 2018/0170044 A1* | 6/2018 | Mawatari | ............ | C23C 14/088 |

* cited by examiner

PIEZOELECTRIC SENSING MODULE, PIEZOELECTRIC SENSING MODULE DETECTING METHOD, AND PIEZOELECTRIC SENSING DETECTION SYSTEM THEREOF

BACKGROUND OF THE INVENTION

1. Field of the Invention

The present invention relates to a piezoelectric sensing module, a piezoelectric sensing module detection method, and a piezoelectric sensing detection system thereof, and more particularly, to a piezoelectric sensing module and piezoelectric sensing module detection method, and a piezoelectric sensing detection system thereof capable of measuring stressed conditions of various machine tools.

2. Description of the Related Art

As technology advances, there have been many studies on the cutting force measurement of a machine tool, so that a large amount of cutting measurement data can be obtained to further improve the cutting method to enhance the accuracy and efficiency or to monitor the cutting condition, thereby preventing the machine tool from damage or processing failure. Measuring the cutting force of the machine tool is the main focus of the development of the intelligent machine tool in recent years. In the prior art, a dynamometer was placed on the workpiece end of the machine tool to indirectly measure the force. However, several disadvantages of the dynamometer such as its accuracy, cost and vulnerability are difficult to overcome in the prior art. In addition, as for the milling process, if a PVDF piezoelectric film sensor with a general 33-type polarization, d31 direction load is used to measure tool surface deformation, at least three sets of six sensors must be used and attached on the tool, then it can be measured by complex calculations. Besides, three out of six sensors are required to be in proper angle with the cutting direction to provide the correct value, which increases the difficulty of measurement.

Therefore, it is necessary to provide a new piezoelectric sensing module, a piezoelectric sensing module detection method and a piezoelectric sensing detection system thereof to improve the deficiencies of the prior art.

SUMMARY OF THE INVENTION

The main object of the present invention is to provide a piezoelectric sensing module, which has the effect of measuring the stressed conditions of a plurality of machine tools.

Another main object of the present invention is to provide a detection method for use with the piezoelectric sensing module described above.

Another main object of the present invention is to provide a piezoelectric sensing detection system having the piezoelectric sensing module described above.

In order to achieve the above objects, the present invention a piezoelectric sensing module of the present invention is disposed on an operating tool of a machine tool. The piezoelectric sensing module comprises a piezoelectric sensing film, the piezoelectric sensing film at least comprising a first electrode, a second electrode, a third electrode, a fourth electrode, a fifth electrode and a sixth electrode, wherein the first electrode is disposed between the third electrode and the fourth electrode, the second electrode is disposed between the fifth electrode and the sixth electrode; wherein the first and the second electrodes, the third and the fifth electrodes, and the fourth and the sixth electrodes are separated by a certain distance respectively, and when the piezoelectric sensing film is attached to the operating tool, a first angle between the first and the second electrodes, a second angle between the third and the fifth electrodes, and a third angle between the fourth and the sixth electrodes on the operating tool each have an included angle of 90 degrees.

The piezoelectric sensing module detection method of the present invention comprises the steps of: providing a piezoelectric sensing film, wherein the piezoelectric sensing film comprises a first electrode, a second electrode, a third electrode, a fourth electrode, a fifth electrode and a sixth electrode disposed thereon; attaching the piezoelectric sensing film on a cutter unit, so that a first angle between the first and the second electrodes, a second angle between the third and the fifth electrodes, and a third angle between the fourth and the sixth electrodes on the operating tool each have an included angle of 90 degrees.

A piezoelectric sensing detection system of the present invention is provided for a machine tool. The machine tool comprises an operating tool. The piezoelectric sensing detection system comprises a piezoelectric sensing module and a signal processing module. The piezoelectric sensing module is disposed on the operating tool, when the operating tool is operating, the piezoelectric sensing module obtains a piezoelectric sensing signal. The piezoelectric sensing module comprises a piezoelectric sensing film, which at least comprises a first electrode, a second electrode, a third electrode; a fourth electrode; a fifth electrode; and a sixth electrode disposed thereon, wherein the first electrode is disposed between the third electrode and the fourth electrode, the second electrode is disposed between the fifth electrode and the sixth electrode; wherein the first and the second electrodes, the third and the fifth electrodes, and the fourth and the sixth electrodes are separated by a certain distance respectively, and when the piezoelectric sensing film is attached to the operating tool, a first angle between the first and the second electrodes, a second angle between the third and the fifth electrodes, and a third angle between the fourth and the sixth electrodes on the operating tool each have an included angle of 90 degrees. The signal processing module is electrically connected with the piezoelectric sensing module to obtain a stressed condition of the operating tool according to the piezoelectric sensing signal.

DETAILED DESCRIPTION OF THE PREFERRED EMBODIMENT

For better understanding of the technical features of the present invention, preferred embodiments are described below.

Figure 1:
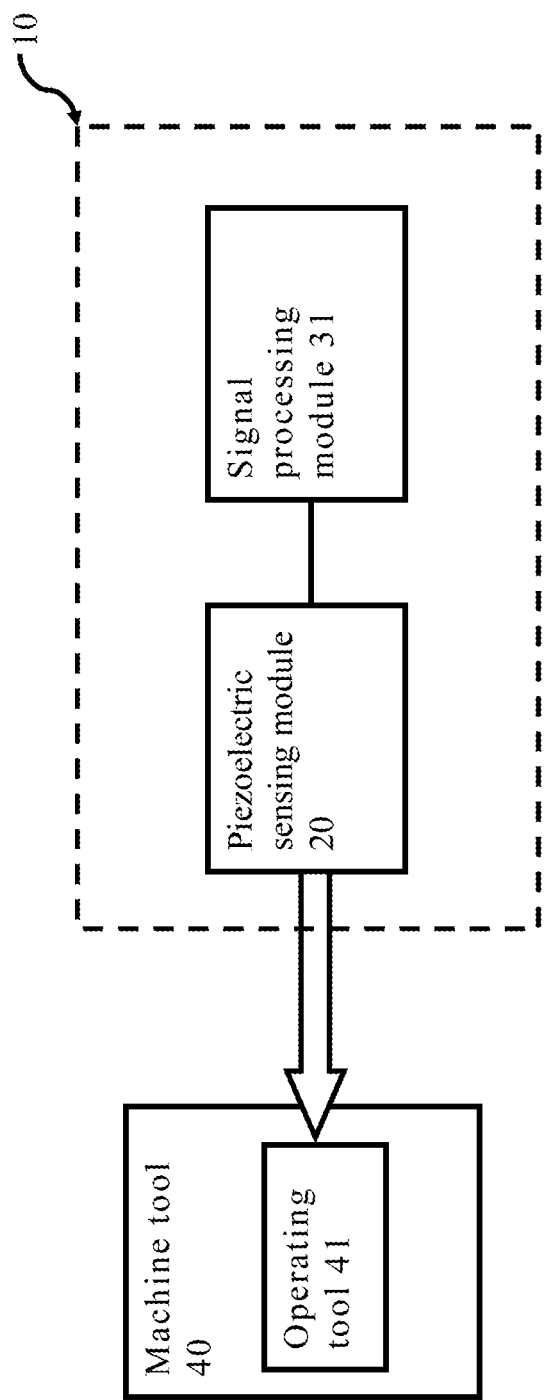
FIG. 1 illustrates a structural view of a piezoelectric sensing detection system the present invention.

Please refer to FIG. 1 for a structural diagram of a piezoelectric sensing detection system the present invention.

A piezoelectric sensing detection system 10 of the present invention is used for detecting a stress applied on a machine or an object. In an embodiment of the present invention, the piezoelectric sensing detection system 10 of the present invention is used for a machine tool 40, but the invention is not limited thereto. The machine tool 40 comprises an operating tool 41 for processing a workpiece 50 (as shown in FIG. 6A). In this embodiment, the operating tool 41 is a milling tool for processing the workpiece 50; however, the piezoelectric sensing detection system 10 of the present invention can be used with other types of processing tools. The piezoelectric sensing detection system 10 can comprise a piezoelectric sensing module 20 and a signal processing module 31. The piezoelectric sensing module 20 is disposed at the position of the operating tool 41 where it is not in contact with the workpiece 50. When the operating tool 41 is processing the workpiece 50, the piezoelectric sensing module 20 is capable of sensing a piezoelectric sensing signal due to the deformation of the stressed surface of the operating tool 41. The piezoelectric sensing module 20 is electrically connected with the signal processing module 31 through a wireless scheme so as to transmit the measured piezoelectric sensing signal to the signal processing module 31. The signal processing module 31 is electrically connected with the piezoelectric sensing module 20 to obtain a stressed condition of the operating tool 41, that is, a feed force, a transverse force or a tangential force according to the piezoelectric sensing signal. The signal processing module 31 may be configured as a hardware device, a software program, a firmware, or a combination thereof, and may also be configured as a circuit loop or other suitable implementations. Besides, each module may be independently configured or can also be combined with other module(s). In addition, the present embodiment only illustrates a preferred embodiment of the present invention. All possible combinations of changes are not described in detail for the sake of brevity.

Figure 2:
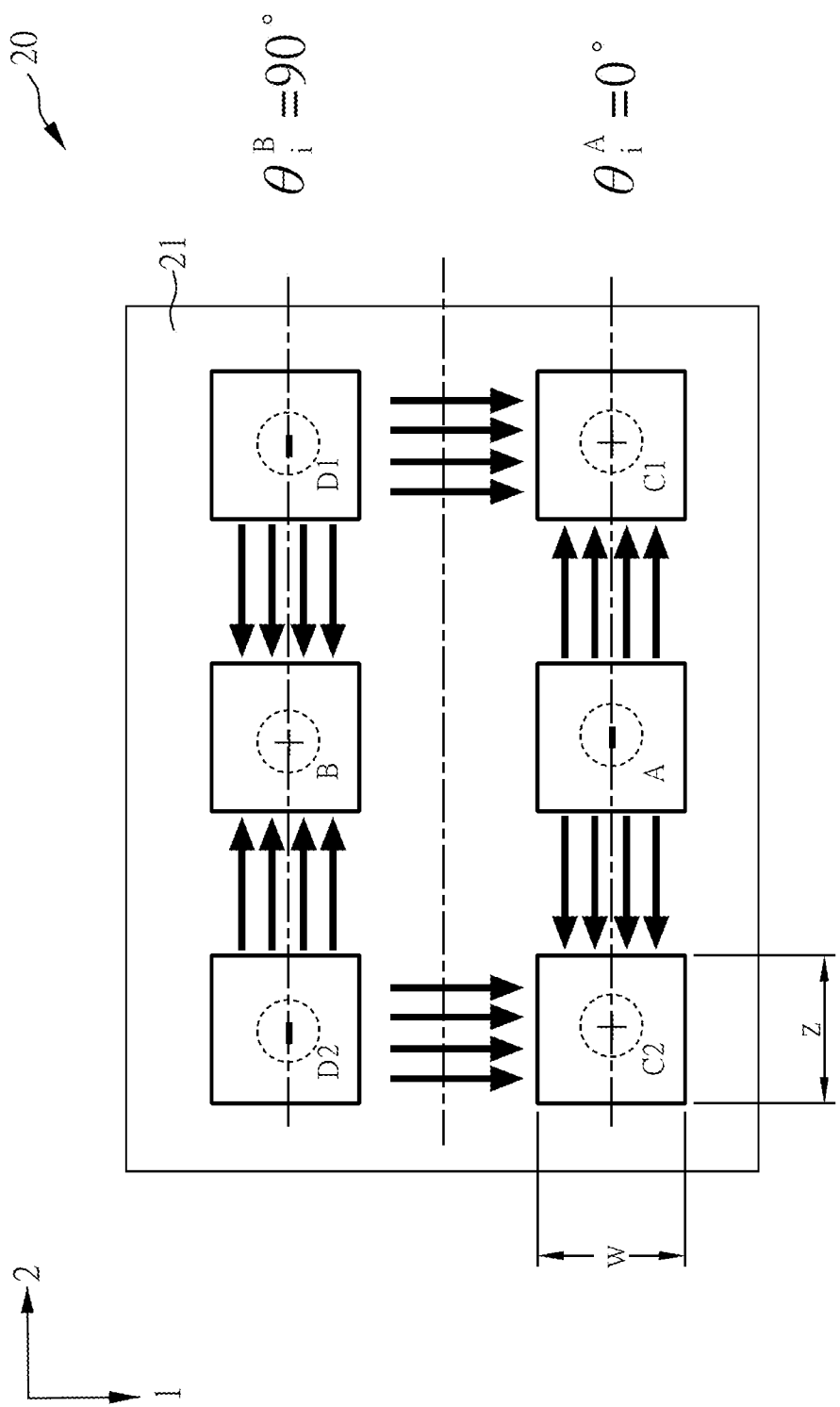
FIG. 2 illustrates a schematic view of the polarization of the piezoelectric sensing module of the present invention.

The technique of the piezoelectric sensing module 20 is shown in FIG. 2, which a schematic view of the polarization of the piezoelectric sensing module of the present invention.

In an embodiment of the present invention, the piezoelectric sensing module 20 comprises a piezoelectric sensing film 21, wherein the piezoelectric sensing film 21 comprises a first electrode A, a second electrode B, a third electrode C1, a fourth electrode C2, a fifth electrode D1, and a sixth electrode D2 disposed thereon. The piezoelectric sensing film 21 is a polyvinylidene difluoride (PVDF) film, but the piezoelectric sensing film 21 of the present invention is not limited to the use of such a material, it can be made of other materials such as d13 or d33 type of electrodes. In FIG. 2, the direction 1 and the direction 2 of the piezoelectric sensing film 21 is shown, and the direction 3 is perpendicular to the piezoelectric sensing film 21, which is not shown in FIG. 2. Since the process of manufacturing the piezoelectric sensing film 21 is well known to those who ordinarily skilled in the art, its principle will not be further described.

The piezoelectric sensing film 21 has four corners, wherein the third electrode C1, the fourth electrode C2, the fifth electrode D1 and the sixth electrode D2 are attached closely to each one of the four corners of the piezoelectric sensing film 21 respectively. The first electrode A is disposed between the third electrode C1 and the fourth electrode C2, the second electrode B is disposed between the fifth electrode D1 and the sixth electrode D2. Furthermore, the first electrode A and the second electrode B, the third electrode C1 and the fifth electrode D1 and the fifth electrode D1 and the fourth electrode C4 and the sixth electrode are separated by a certain distance respectively. In this embodiment, the first electrode A is polarized in the direction of the third electrode C1 and the fourth electrode C2, the fifth electrode D1 and the sixth electrode D2 are polarized in the direction of the second electrode B. The fifth electrode D1 is polarized in the direction of the third electrode C1, and the sixth electrode D2 is polarized in the direction of the fourth electrode C2.

Figure 3B:
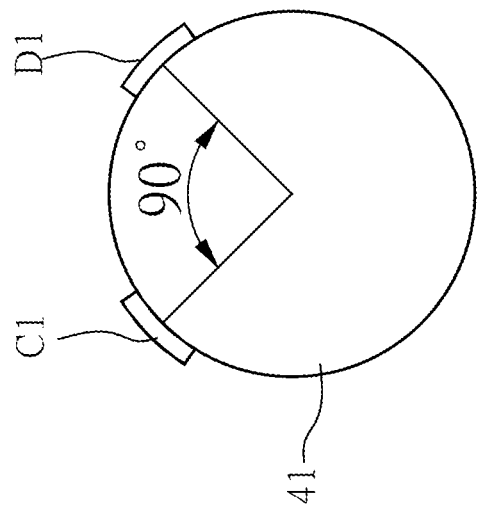
FIG. 3B illustrates a cross-sectional view of the piezoelectric sensing module of the present invention attached to a cutter unit.
Figure 3A:
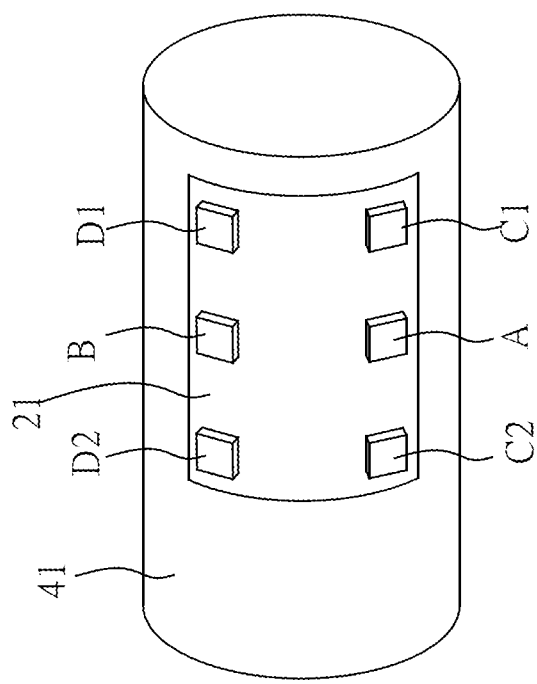
FIG. 3A illustrates a side view of the piezoelectric sensing module of the present invention attached to a cutter unit.

Please also refer to FIG. 3A for a side view of the piezoelectric sensing module of the present invention attached to a cutter unit and FIG. 3B for a cross-sectional view of the piezoelectric sensing module of the present invention attached to the cutter unit.

When the piezoelectric sensing film 21 is attached to the operating tool 41, a first angle between the first electrode A and the second electrode B, a second angle between the third electrode C1 and the fifth electrode D1, and a third angle between the fourth electrode C2 and the sixth electrode D2 on the operating tool each have an included angle of 90 degrees. In other words, if the positions of the first electrode A, the third electrode C1 and the fourth electrode C2 are located at a 0 degree angle of the operating tool 41, then the positions of the second electrode B, the fifth electrode D1 and the sixth electrode D2 are located at a 90 degree angle of the operating tool 41. This makes it easy to calculate the stressed condition of the operating tool 41. However, the present invention is not limited thereto. If the electrodes are not disposed at the angles of 0 degrees and 90 degrees respectively, the stressed condition of the operating tool 41 can be obtained by using statistical analysis.

Figure 4:
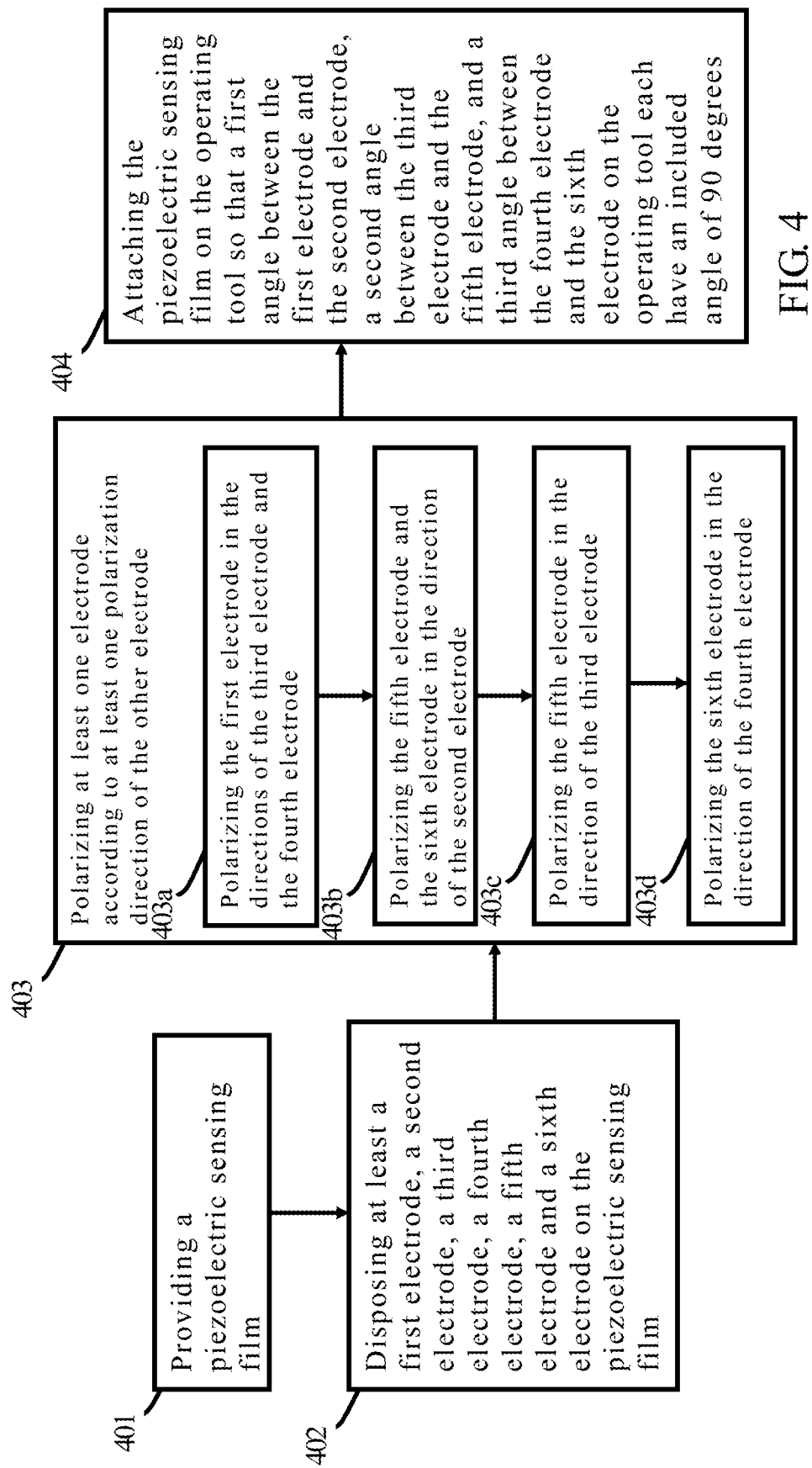
FIG. 4 illustrates a flow chart of a detecting method of the piezoelectric sensing module of the present invention.

Next, please refer to FIG. 4 for a flow chart of a detecting method of the piezoelectric sensing module of the present invention. It is noted that although the piezoelectric sensing module 20 is used as an example to explain the detection method of the piezoelectric sensing module of the present invention, the detection method of the module piezoelectric sensing module is not limited to the use with piezoelectric sensing modules having the same structure as that of the piezoelectric sensing module 20.

First the method proceeds to step 401: providing a piezoelectric sensing film.

First, a polyvinylidene fluoride film is provided, and a piezoelectric sensing film 21 is made by cold stretching, solid phase extrusion and grinding. Since the process of manufacturing the piezoelectric sensing film 21 is well known to those who ordinarily skilled in the art, its principle will not be further described.

Then the method proceeds to step 402: disposing at least a first electrode, a second electrode, a third electrode, a fourth electrode, a fifth electrode and a sixth electrode on the piezoelectric sensing film.

Next, attaching the first electrode A, the second electrode B, the third electrode C1, the fourth electrode C2, the fifth electrode D1 and the sixth electrode D2 on the piezoelectric sensing film 21, wherein the first electrode A and the second electrode B, the third electrode C1 and the fourth electrode C2, and the fifth electrode D1 and the sixth electrode D2 are separated by a certain distance respectively.

Then the method proceeds to step 403: polarizing at least one electrode according to at least one polarization direction of the other electrode.

Then, at least one electrode is polarized in accordance with at least one polarization direction of the other electrode, so that the piezoelectric sensing module 20 can have a plurality of polarization directions In an embodiment of the present invention, step 403 can include the step 403a to step 403d, but the present invention is not limited thereto.

First the method proceeds to 403a: polarizing the first electrode in the directions of the third electrode and the fourth electrode.

First the first electrode A is applied with a high positive voltage, the third electrode C14 and the fourth electrode C2 are either grounded or applied with a negative high voltage, thereby polarizing the first electrode A in the directions of the third electrode C1 and the fourth electrode C4.

Then the method proceeds to step 403b: polarizing the fifth electrode and the sixth electrode in the direction of the second electrode.

Thereafter, using the same polarizing method, the fifth electrode D1 and the sixth electrode D2 are polarized in the direction of the second electrode.

Then the method proceeds to step 403c: polarizing the fifth electrode in the direction of the third electrode.

Next, the fifth electrode D1 is polarized in the direction of the third electrode C1.

Next the method proceeds to step 403d: polarizing the sixth electrode in the direction of the fourth electrode.

Then the sixth electrode D2 is polarized in the direction of the fourth electrode C2 to manufacture the piezoelectric sensing module 20. In this way, the piezoelectric sensing module 20 can have six polarization directions.

Finally the method proceeds to step 404: attaching the piezoelectric sensing film on the operating tool so that a first angle between the first electrode and the second electrode, a second angle between the third electrode and the fifth electrode, and a third angle between the fourth electrode and the sixth electrode on the operating tool each have an included angle of 90 degrees.

Finally, the piezoelectric sensing film 21 is attached to the operating tool 41, and in this embodiment, the piezoelectric sensing film 21 is matched with the shape of the operating tool 41. The first electrode A, the third electrode C1 and the fourth electrode C2 are located at the same angle, and the second electrode B, the fifth electrode D1 and the sixth electrode D2 are located at another angle. A first angle between the first electrode A and the second electrode B, a second angle between the third electrode C1 and the fifth electrode D1, and a third angle between the fourth electrode C2 and the sixth electrode D2 each have an included angle of 90 degrees. That is, if the first electrode A, the third electrode C1 and the fourth electrode C2 are at 0 degree, then the second electrode B, the fifth electrode D1 and the sixth electrode D2 are located at 90 degrees.

It is noted that the detection method of the piezoelectric sensing module of the present invention is not limited to the above-mentioned sequence of steps, the order of the above steps can also be varied as long as the object of the present invention can be achieved.

In this way, the signal processing module 31 can calculate a feed force and a transverse force of the operating tool 41 according to the piezoelectric sensing signal obtained by the first electrode A and the second electrode B, and can use the piezoelectric sensing signal obtained by the first electrode A to the sixth electrode D2 to calculate a tangential force of the operating tool 41.

Figure 5:
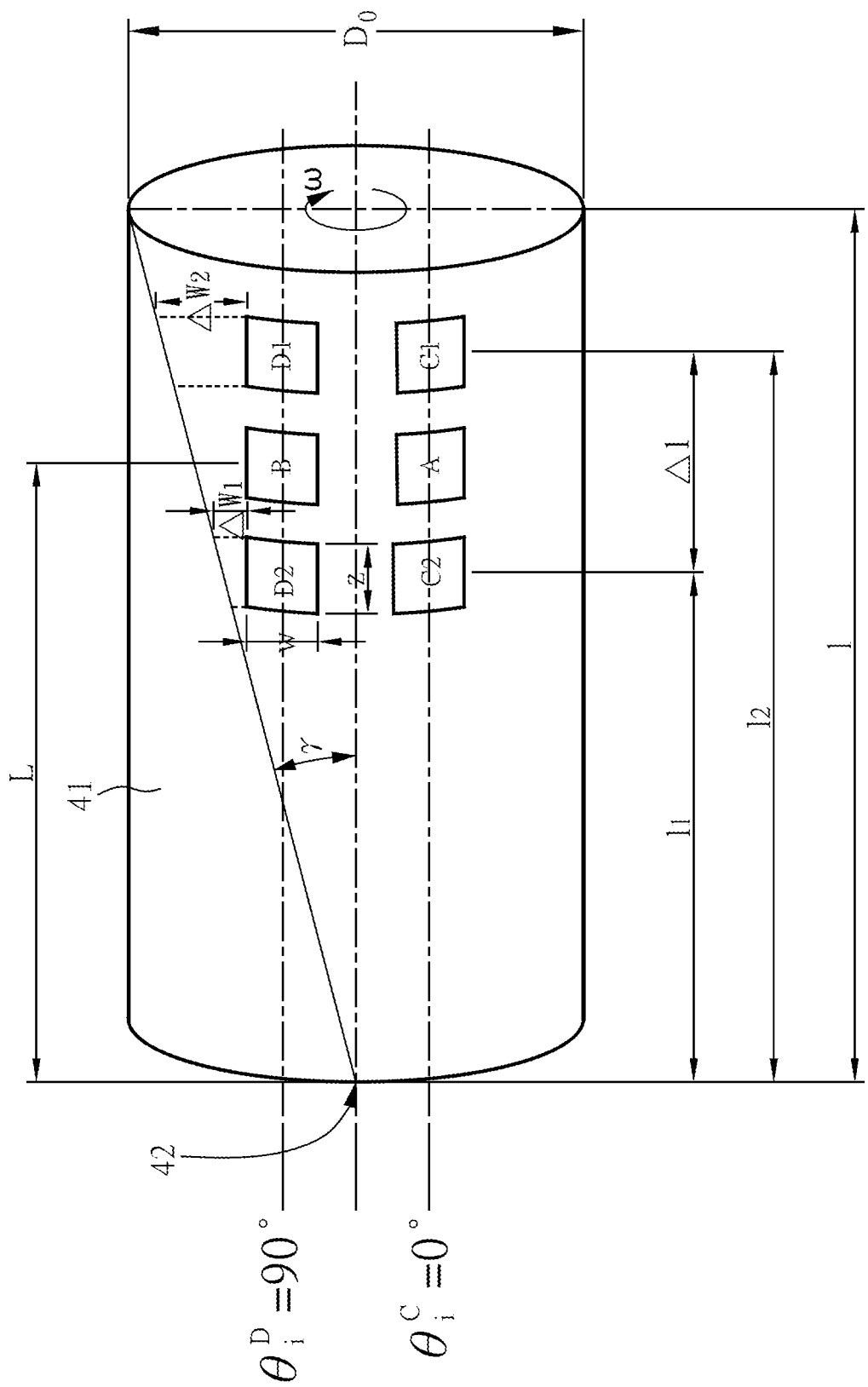
FIG. 5 illustrates a schematic view of the relationship between each electrode of the present invention and an operating tool.
Figure 6B:
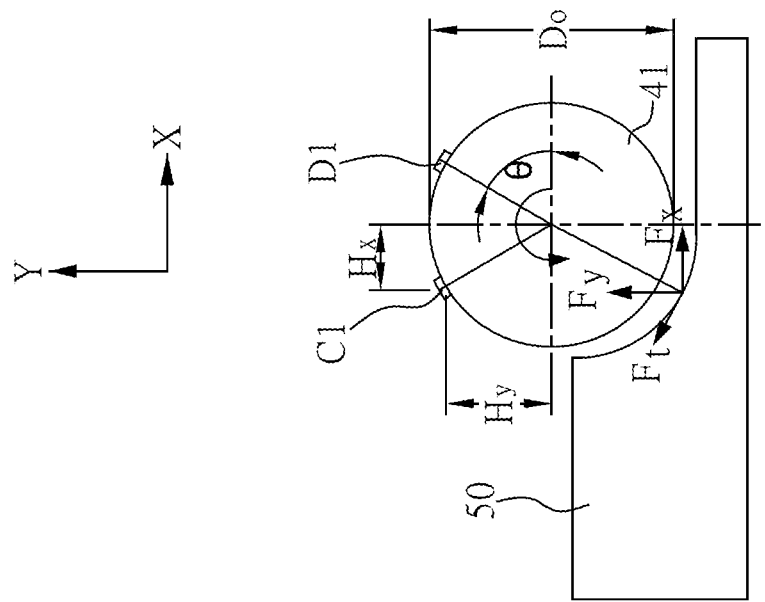
FIG. 6B illustrates a cross-sectional view of the piezoelectric sensing detection module of the present invention disposed on a milling tool.
Figure 6A:
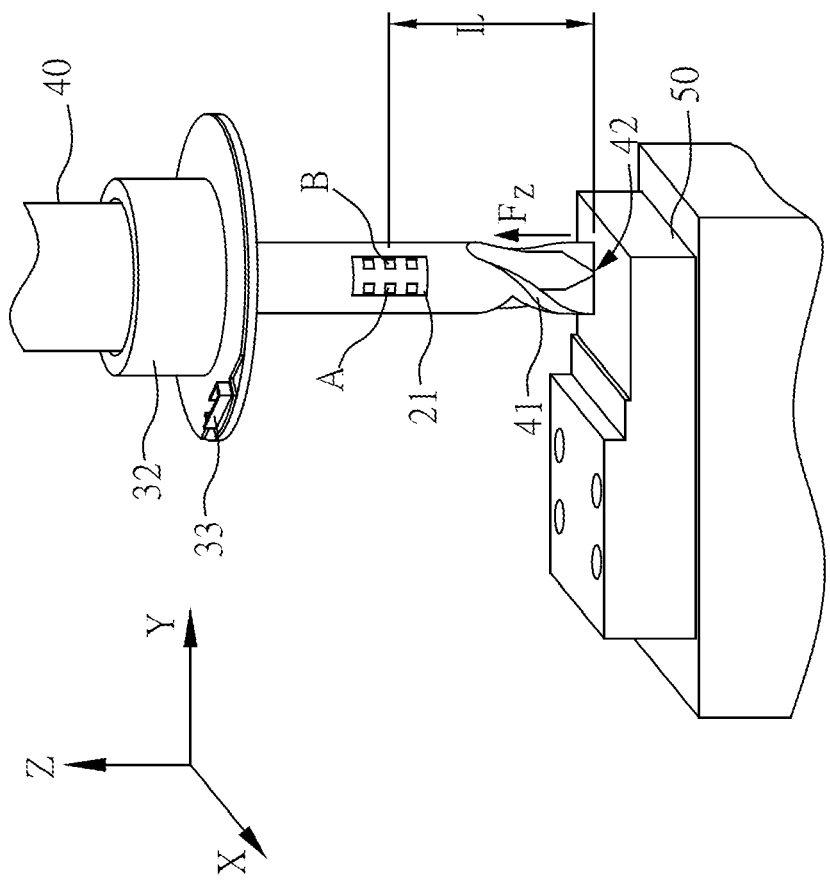
FIG. 6A illustrates a schematic view of the piezoelectric sensing detection module of the present invention disposed on a milling tool.

Next, please refer to FIG. 5 to FIG. 6B. FIG. 5 illustrates a schematic view of the relationship between each electrode of the present invention and an operating tool; FIG. 6A illustrates a schematic view of the piezoelectric sensing detection module of the present invention disposed on a milling tool; FIG. 6B illustrates a cross-sectional view of the piezoelectric sensing detection module of the present invention disposed on a milling tool.

FIG. 5 shows the relationship of the lengths and the angles among the first electrode A, the second electrode B, the third electrode C1, the fourth electrode C2, the fifth electrode D1, the sixth electrode D2 and the operating tool 41. The calculation of various forces is based on the relationship shown in FIG. 5, but the present invention is not limited to the application described herein.

When the operating tool 41 is milling, the forces generated in the directions of X axis, Y axis, Z axis can be denoted as $F_x$, $F_y$, $F_z$. The strain of the shaft of the operating tool 41 can be defined as:

$$\varepsilon_a = \frac{F_x L H_x + F_y L H_y}{E_{ct} I_{zz}},$$

wherein the length in the X axis direction is $H_x = D_0/2 \cos(\theta+\theta_i)$, the length in the Y axis direction is $H_y = D_0/2 \sin(\theta+\theta_i)$, angle $\theta = \omega t + \emptyset_0$ and $\omega$ is the rotation angle, $\emptyset_0$ is the angle between the sensor and the initial cutting end, $\theta_i$ is the initial angle of every sensor, L is the distance between the first electrode A and the second electrode B to the cutting end 42, $E_{ct}$ is the Young's modulus of the operating tool 41, $D_0$ and $I_{zz}$ is the diameter and moment of inertia of the operating tool 41, finally $F_x$ and $F_y$ are forces acting along the X and Y axes, which are the feed force and the transverse force respectively in this embodiment. When the initial angles of the first electrode A and the second electrode B are $\theta_i^A$ and $\theta_i^B$, it can be obtained that:

$$\begin{bmatrix} \varepsilon_a^A \\ \varepsilon_a^B \end{bmatrix} = \begin{bmatrix} \left[F_x L \frac{D_0}{2}\cos(\theta+\theta_i^A) + F_y L \frac{D_0}{2}\sin(\theta+\theta_i^A)\right] / \left[E_{ct}\left(\frac{\pi D_0^4}{64}\right)\right] \\ \left[F_x L \frac{D_0}{2}\cos(\theta+\theta_i^B) + F_y L \frac{D_0}{2}\sin(\theta+\theta_i^B)\right] / \left[E_{ct}\left(\frac{\pi D_0^4}{64}\right)\right] \end{bmatrix} = \begin{bmatrix} LD \times F_{xy}^A \\ LD \times F_{xy}^B \end{bmatrix},$$

wherein $LD = 32L/[E_{ct}(\pi D_0^3)]$, and $F_{xy}^A = F_y \cos(\theta+\theta_i^A) + F_x \sin(\theta+\theta_i^A)$ $F_{xy}^B = F_y \cos(\theta+\theta_i^B) + F_x \sin(\theta+\theta_i^B)$.

In the embodiment of the present invention, the angle between the first electrode A and the second electrode B is 90 degrees, therefore, by using $\theta_i^A = 0°$ and $\theta_i^B = 90°$, it can be obtained that: $F_{xy}^A = F_y \cos(\theta) + F_x \sin(\theta)$ and $F_{xy}^B = F_y \cos(\theta + 90°) + F_x \sin(\theta + 90°)$.

The formula representing piezoelectricity can be:

$$\begin{bmatrix} D_e \\ S \end{bmatrix} = \begin{bmatrix} e^\sigma & d \\ d^T & S^E \end{bmatrix} \begin{bmatrix} E \\ \sigma \end{bmatrix},$$

wherein $D_e$ is the electric displacement, S is the amount of deformation, $e^\sigma$ is the dielectric constant, d and $d^T$ are piezoelectric coefficients, $S^E$ is the elastic coefficient under constant electric field. In an embodiment of the present invention, the piezoelectric sensing film 21 does not have an extended electric field, so the electric displacement can be represented by: $[D_e] = [d][\sigma]$. Therefore, in an embodiment of the present invention, according to the polarization method of the piezoelectric sensing film 21, the electric displacement can be represented as:

$$\begin{bmatrix} D_e^A \\ D_e^B \end{bmatrix} = [d][\sigma] = \begin{bmatrix} d_{13}^A & \varepsilon_a^A \\ d_{13}^B & \varepsilon_a^B \end{bmatrix} E_P = \begin{bmatrix} d_{13}^A \times LD \times F_{xy}^A \\ d_{13}^B \times LD \times F_{xy}^B \end{bmatrix} E_P,$$

wherein $E_p$ is the Young's modulus of the piezoelectric sensing film 21, $d_{13}$ is the piezoelectric coefficient, $d_{13}^A$ and $d_{13}^B$ are the piezoelectric coefficients of the first electrode A and the second electrode B. The amount of electricity q obtained by each electrode can be defined as:

$$\begin{bmatrix} q^A \\ q^B \end{bmatrix} = \int \begin{bmatrix} D_e^A \\ D_e^B \end{bmatrix}^T$$

$$dA = \int \begin{bmatrix} D_e^A \\ D_e^B \end{bmatrix}_{zx} dA_{31} + \int \begin{bmatrix} D_e^A \\ D_e^B \end{bmatrix}_{yz} dA_{23} + \int \begin{bmatrix} D_e^A \\ D_e^B \end{bmatrix}_{xy}$$

$$dA_{12} = \begin{bmatrix} d_{13}^A \times LD \times F_{xy}^A \\ d_{13}^B \times LD \times F_{xy}^B \end{bmatrix}$$

$$E_P A_{12} = \begin{bmatrix} K^A \times F_{xy}^A \\ K^B \times F_{xy}^B \end{bmatrix}.$$

A is the cross-sectional area of the piezoelectric sensing film, $A_{31}$ and $A_{23}$ are very small and can be ignored, and $K^A = d_{13}^A \times LD \times E_p A_{12}$, $K^B = d_{13}^B \times LD \times E_p A_{12}$. Since the amount of electricity $$Q = \begin{bmatrix} q^A \\ q^B \end{bmatrix} = C_q V,$$

$C_q$ is the capacitance of the electrode, so that the measured voltage is $$V = \begin{bmatrix} V^A \\ V^B \end{bmatrix} = \begin{bmatrix} q^A/C_q \\ q^B/C_q \end{bmatrix} = \begin{bmatrix} (K^A F_{xy}^A)/C_q \\ (K^B F_{xy}^B)/C_q \end{bmatrix}.$$

Finally it can be obtained that $$\begin{bmatrix} F_{xy}^A = C_q V^A / K^A \\ F_{xy}^B = C_q V^B / K^B \end{bmatrix}.$$

It can be seen from the above formula that after the piezoelectric sensing signal is obtained by measuring the first electrode A and the second electrode B, the feed force and the transverse force of the operating tool 41 can be obtained.

In an embodiment of the present invention, the operating tool 41 is affected by force to generate a twist angle γ, a diameter $D_0$ and a length l during the cutting process, with its cutting end 42 being in contact with the workpiece 50. The extension lines of the sixth electrode D2 and the fifth electrode D1 to the twist angle γ have a distance $\Delta w_1$ and a distance $\Delta w_2$ respectively. Therefore, according to the elastic torsion formula, it can be obtained that:

$$\gamma = \tau \frac{(D_0/2)}{JG} = \frac{F_t(D_0/2)^2}{JG}$$

and $\tau = F_t(D_0/2)$, wherein $d_0$ is the diameter of the operating tool 41, J is the polar moment of inertia, and G is the modulus of rigidity. The above formula can be further re-written as $$\gamma = \frac{F_t(D_0/2)^2}{JG} = \mathrm{atan}\left(\frac{\Delta \varepsilon w}{\Delta l}\right) \text{ and } F_t = \frac{JG}{(D_0/2)^2} \gamma \text{ or}$$

$$\tau = \frac{JG}{(D_0/2)} \gamma.$$

The initial angle of the third electrode C1 and the fourth electrode C2 is $\theta_i^C = 0°$. The initial angle of the fifth electrode D1 and the sixth electrode D2 is $\theta_i^D = 90°$. Besides, the distance of the fourth electrode C2 and the sixth electrode D2 to the cutting end 42 is $l_1$, the distance of the third electrode C1 and the fifth electrode D1 to the cutting end 42 is $l_2$, the third electrode C1 and the fourth electrode C2 are separated by a distance $\Delta l$, and the fifth electrode D1 and sixth electrode D2 are also separated by the distance $\Delta l$. Therefore, it can be obtained that: $l_2 \tan \gamma - w = \Delta w_2$, $l_1 \tan \gamma - w = \Delta w_1$. Hence, $(l_1 - l_2) \tan \gamma = \Delta l \tan \gamma = \Delta w_2 - \Delta w_1 = (\varepsilon_{t2} - \varepsilon_{t1}) w = \Delta \varepsilon w$, the formula can be re-written as:

$$\tan \gamma = \frac{\Delta \varepsilon_t w}{\Delta l}$$

or $\Delta \varepsilon = \Delta l \tan \gamma / w$, wherein $\varepsilon_t$ is the strain generated by the torque applied on the third electrode C1 and the fourth electrode C2, or the fifth electrode D1 and the sixth electrode D2 of the piezoelectric sensing module 20.

The relationship of the tangential force with regard to the feed force and the transverse force is: $F_t = F_x \sin \theta - F_y \cos \theta$. Take the type 31 polarized electrode as an example, the electric displacement can be obtained as: $D_e = [d][\sigma] = d_{13} \varepsilon E_p$;

$q=D_eA=d_{13}\varepsilon E_p(wz)$, wherein z and w are the length and width of any electrode respectively. Since $$Q = \begin{bmatrix} q^C \\ q^D \end{bmatrix} = C_q V,$$

therefore, the amount of electricity between the third electrode C1 and the fourth electrode C2 is calculated to be: $Q^{C2}-Q^{C1}=\Delta Q^C=C_q\Delta V^C=(D_e^{C2}-D_e^{C1})A_{12}=d_{13}(\varepsilon_{t2}^{C2}-\varepsilon_{t1}^{C1})E_p(wz)=d_{13}\Delta\varepsilon E_p(wz)$, wherein $C_q$ is the capacitance of the electrode. Therefore, the voltage difference between the third electrode C1 and the fourth electrode C2 is:

$$\Delta V^C = \left(\frac{1}{C_q}\right) d_{13}\Delta\varepsilon E_P(wz) =$$

$$\left(\frac{1}{C_q}\right) d_{13}\left(\frac{\Delta l \tan\gamma}{w}\right) E_P(wz) = \left[\frac{1}{C_q} d_{13} E_P z \Delta l\right] \tan\gamma = k \tan\gamma,$$

wherein $k = \frac{1}{C_q} d_{13} E_P z \Delta l$ is a known constant. When $\Delta V^C$ is obtained, the twist angle is calculated to be $$\gamma = \frac{F_t(D_0/2)^2}{JG} = a\tan\left(\frac{\Delta V}{k}\right)^C,$$

and the tangential force is $$F_t = \frac{JG}{(D_0/2)^2} a\tan\left(\frac{\Delta V}{k}\right)^C = F_x \sin\theta - F_y \cos\theta.$$

For the third electrode C1 and the fourth electrode C2 having the initial angle of $\theta_i^C=0°$, the tangential force $F_t$ is $$F_x \sin(\theta_i^C + \theta) - F_y \cos(\theta_i^C + \theta) =$$

$$F_x \sin\theta - F_y \cos\theta = \frac{JG}{(D_0/2)^2} a\tan\left(\frac{\Delta V^C}{k}\right).$$

And for the fifth electrode D1 and the sixth electrode D2 having the initial angle of $\theta_i^D=90$, the tangential force $F_t$ is $$F_x \sin(\theta_i^D + \theta) - F_y \cos(\theta_i^D + \theta) =$$

$$F_x \sin(90° + \theta) - F_y \cos(90° + \theta) = \frac{JG}{(D_0/2)^2} a\tan\left(\frac{\Delta V^D}{k}\right).$$

Next, consider the first electrode A, the third electrode C1 and the fourth electrode C2 having the angle of 0 degree all together, it can be obtained that:

$$F_{xy}^A = \frac{C_q V^A}{K^A} = F_x \sin\theta + F_y \cos\theta \text{ and}$$

$$\frac{JG}{(D_0/2)^2} a\tan\left(\frac{\Delta V^C}{k}\right) = F_x \sin\theta + F_y \cos\theta,$$

and from the above two equations:

$$2F_x \sin\theta = \frac{C_q V^A}{K^A} + \frac{JG}{(D_0/2)^2} a\tan\left(\frac{\Delta V^C}{k}\right) \text{ and}$$

$$2F_y \cos\theta = \frac{C_q V^A}{K^A} - \frac{JG}{(D_0/2)^2} a\tan\left(\frac{\Delta V^C}{k}\right).$$

For the second electrode B, the fifth electrode D1 and the sixth electrode D2 having the angle of 90 degrees, it can be obtained that:

$$F_{xy}^B = \frac{C_q V^B}{K^B} = F_x \sin(90° + \theta) + F_y \cos(90° + \theta) \text{ and}$$

$$\frac{JG}{R^2} a\tan\left(\frac{\Delta V^D}{k}\right) = F_x \sin(90° + \theta) + F_y \cos(90° + \theta),$$

and from the above two equations:

$$2F_x \sin(90° + \theta) = \frac{CV^B}{K^B} + \frac{JG}{(D_0/2)^2} a\tan\left(\frac{\Delta V^D}{k}\right) \text{ and}$$

$$2F_x \cos(90° + \theta) = \frac{CV^B}{K^B} - \frac{JG}{(D_0/2)^2} a\tan\left(\frac{\Delta V^D}{k}\right) \circ$$

Therefore, from the above formula, it can be obtained that:

Feed force $F_x = \frac{1}{2}\sqrt{(\zeta^2 + \eta^2)}$ and

Transverse force $F_y = \frac{1}{2}\sqrt{(\zeta'^2 + \eta'^2)}$, wherein $$\zeta = \frac{C_q V^A}{K^A} + \frac{JG}{(D_0/2)^2} a\tan\left(\frac{\Delta V^C}{k}\right),$$

$$\eta = \frac{C_q V^B}{K^B} + \frac{JG}{(D_0/2)^2} a\tan\left(\frac{\Delta V^D}{k}\right),$$

$$\zeta' = \frac{C_q V^A}{K^A} - \frac{JG}{(D_0/2)^2} a\tan\left(\frac{\Delta V^C}{k}\right),$$

$$\eta' = \frac{C_q V^B}{K^B} - \frac{JG}{(D_0/2)^2} a\tan\left(\frac{\Delta V^D}{k}\right).$$

As shown in FIG. 6A, in an embodiment of the present invention, a piezoelectric sensing detection system 10 of the present invention is used for an operating tool 41 of a machine tool 40, when the operating tool 41 is processing the workpiece 50, the piezoelectric sensing module 20 can sense the piezoelectric sensing signal by the deformation of the surface of the operating tool 41, and the piezoelectric sensing module 20 can be connected with the signal processing module 30 through a wireless communication scheme. Therefore, in an embodiment of the present invention, the piezoelectric sensing detection system 10 can also comprise a bearing assembly 32 and an antenna module 33.

The bearing assembly 32 is used for mounting the operating tool 41. The antenna module 33 electrically connected to the piezoelectric sensing module 20 for using the reflection of the bearing assembly to transmit the piezoelectric sensing signal to the signal processing module 31 in the vertical direction of the bearing assembly 32. However, the invention is not limited to the use of specific type or shape of the antenna module 33.

Figure 7B:
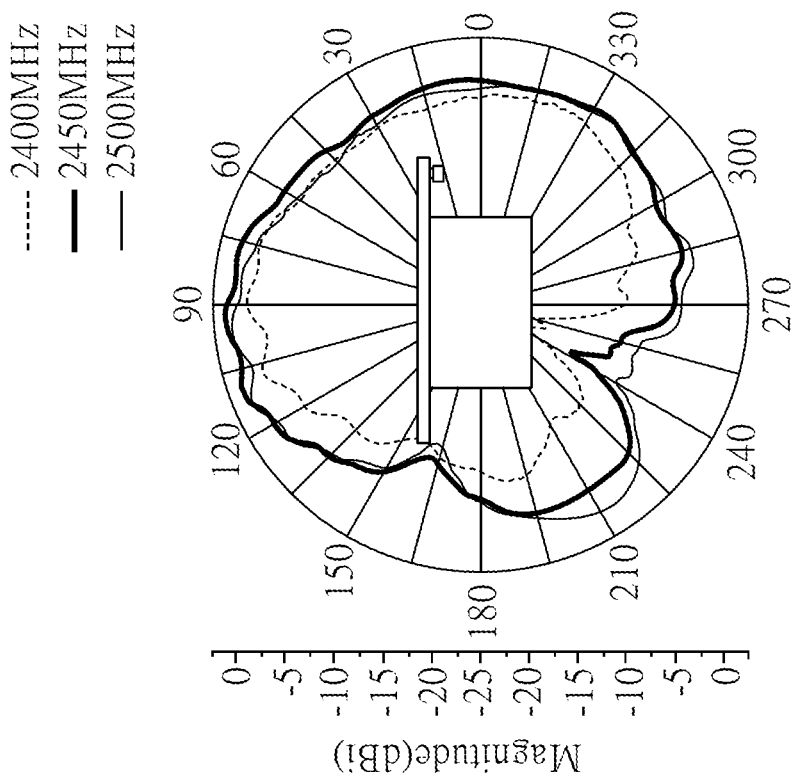
FIG. 7B illustrates a radiation pattern of the antenna module in the vertical direction of the piezoelectric sensing detection system of the present invention.
Figure 7A:
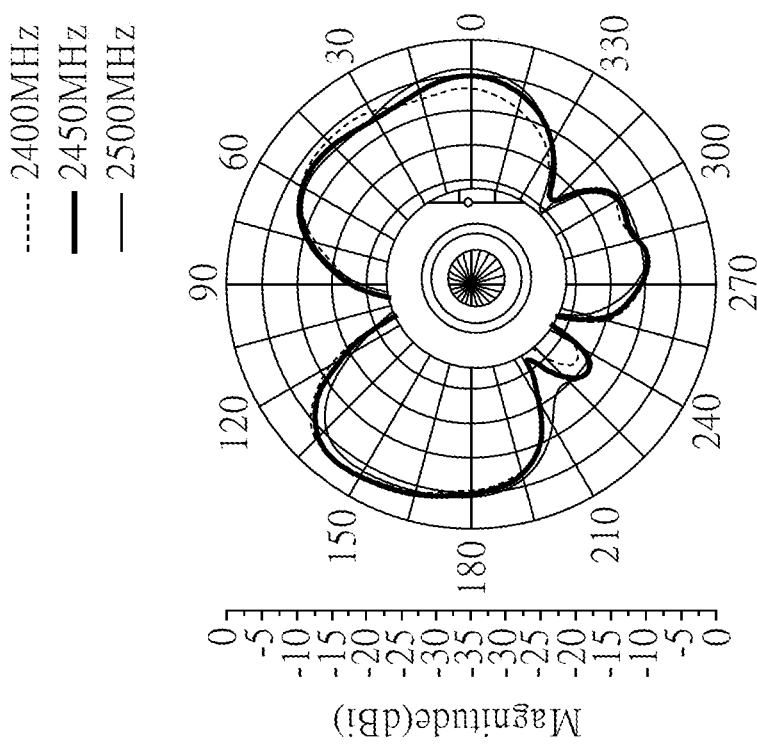
FIG. 7A illustrates a radiation pattern of an antenna module in the horizontal direction of the piezoelectric sensing detection system of the present invention.

As a result, the radiation patterns of the horizontal and vertical directions of the antenna module antenna module 33 are shown in FIG. 7A and FIG. 7B, respectively. FIG. 7A illustrates the radiation pattern of the antenna module in the horizontal direction of the piezoelectric sensing detection system of the present invention; FIG. 7B illustrates the radiation pattern of the antenna module in the vertical direction of the piezoelectric sensing detection system of the present invention.

From FIG. 7A and FIG. 7B, it can be seen that the antenna module 33 of the present invention provides good transmission effects in both horizontal or vertical directions at frequencies of 2.4 GHz, 2.45 GHz and 2.5 GHz, and is not limited to one direction.

In addition, the piezoelectric sensing module 20 of the present invention can also be used to measure the torque of a general electric wrench or a pneumatic wrench. As shown in FIG. 6A, in this embodiment, if the machine tool 40 is an electric wrench or a pneumatic wrench, the cutting end 42 of the operating tool 41 can be regarded as being the locking position, and the workpiece 50 is the object to be locked to the cutting end. Therefore, torque of the electric wrench or the pneumatic wrench can be calculated according to the voltage difference of the voltage sensing signal between the third electrode C1 and the fourth electrode C2, or the fifth electrode D1 and the sixth electrode six electrode D2.

Referring to the formula derived and shown in FIG. 5, the formula for calculating elastic torsion is:

$$\gamma = \tau \frac{(D_0/2)}{JG} = a\tan\left(\frac{\Delta \varepsilon w}{\Delta l}\right).$$

When a distance between the third electrode C1 and the fourth electrode C2, or the fifth electrode D1 and the sixth electrode D2 is $\Delta l$, it can be derived that:

$l_2 \tan \gamma - w = \Delta w_2$ and $l_1 \tan \gamma - w = \Delta w_1$ to obtain $(l_1 - l_2)\tan \gamma = \Delta l \tan \gamma = (\varepsilon_{t2} - \varepsilon_{t1})w = \Delta \varepsilon w$, so that tan $$\gamma = \frac{\Delta \varepsilon_t w}{\Delta l}$$

or $\Delta \varepsilon = \Delta l \tan \gamma / w$.

Next, the electric displacement is obtained according to the length z or the width w of the electrode: $D_e = [d][\sigma] = d_{13}\varepsilon E_p$; $q = D_e A = d_{13}\varepsilon E_p(wz)$. Since $$Q = \begin{bmatrix} q^C \\ q^D \end{bmatrix} = C_q V,$$

then the amount of electricity between the third electrode C1 and the fourth electrode C2 is calculated to be: $Q^{C2} - Q^{C1} = \Delta Q^C = C_q \Delta V^C = (D_e^{C2} - D_e^{C1})A_{12} = d_{13}(\varepsilon_{t2}^C - \varepsilon_{t1}^C)E_p(wz) = d_{13}\Delta\varepsilon E_p(wz)$, wherein $C_q$ is the capacitance of the electrode. The voltage difference is obtained as:

$$\Delta V = \left(\frac{1}{C_q}\right)d_{13}\Delta\varepsilon E_p(wz) =$$

$$\left(\frac{1}{C_q}\right)d_{13}\left(\frac{\Delta l \tan \gamma}{w}\right)E_P(wz) = \left[\frac{1}{C_q}d_{13}E_P z\Delta l\right]\tan \gamma = k\tan\gamma,$$

wherein $k = \frac{1}{C_q}d_{13}E_P z\Delta l$ is a known constant.

In this way, when the voltage difference between the third electrode C1 and the fourth electrode C2 is measured, the rotation angle is obtained as:

$$\gamma = \tau \frac{(D_0/2)}{JG} = a\tan\left(\frac{\Delta V}{k}\right),$$

and the torque of the operating tool 41 is torque $$\tau = \frac{JG}{(D_0/2)}a\tan\left(\frac{\Delta V}{k}\right).$$

Figure 8:
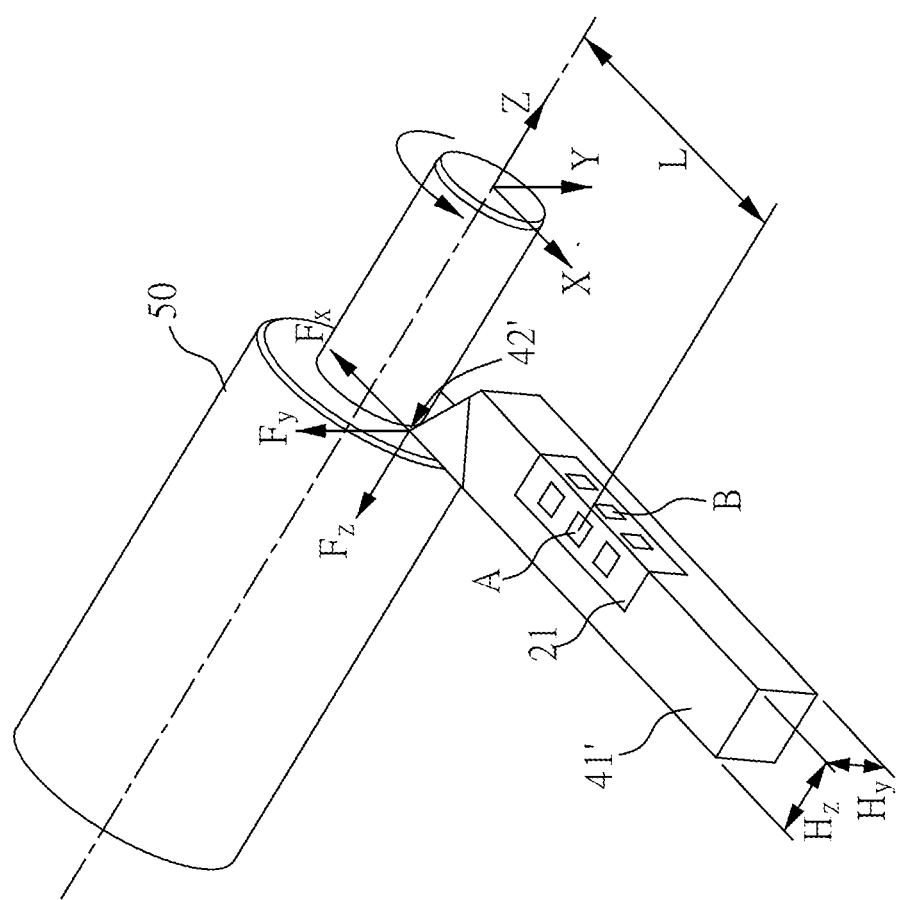
FIG. 8 illustrates a schematic view of the piezoelectric sensing detection module of the present invention disposed on a turning tool.

Next, please refer to FIG. 8 for a schematic view of the piezoelectric sensing detection module of the present invention disposed on a turning tool.

The piezoelectric sensing module 20 of the present invention is also applicable for turning process. In this embodiment, the piezoelectric sensing film 21 can be attached to an operating tool 41' of a turning machine, and a first angle between the first and the second electrodes, a second angle between the third and the fifth electrodes, and a third angle between the fourth and the sixth electrodes on the operating tool each have an included angle of 90 degrees. Therefore, the feed force, transverse force and tangential force of the operating tool 41' can be obtained according to the measured voltages of the first electrode A and the second electrode B.

For example, in the embodiment of FIG. 8 of the present invention, the strains of the first electrode A and the second electrode B can be respectively calculated by the following formula:

$$\varepsilon_t = \frac{F_y L H_y}{E_{ct} I_{zz}} = \frac{6 F_y L}{E_{ct} H_y^3} \text{ and } \varepsilon_f = \frac{F_z L H_z}{E_{ct} I_{yy}} = \frac{6 F_z L}{E_{ct} H_z^3},$$

wherein the strain $\varepsilon_t$ is obtained from the tangential force $F_y$, the strain $\varepsilon_f$ is obtained from the tangential force $F_z$. In this embodiment, the tangential force is the force in the Y axis direction, the feed force is the force in the Z axis direction, so that the $F_y$ is the tangential force, $F_z$ is the feed force. L is the distance of the first electrode A and the second electrode B to the cutting end 42', $H_y$ and $H_z$ are the width and height of the operating tool 41' in the Y axis and Z axis direction, $E_{ct}$ is the Young's modulus of the operating tool 41', $I_{zz}$ and $I_{yy}$ are the area moment of inertia.

And as described in the foregoing description of the present invention, the formula representing piezoelectricity can be:

$$\begin{bmatrix} D_e \\ S \end{bmatrix} = \begin{bmatrix} e^\sigma & d \\ d^T & S^E \end{bmatrix} \begin{bmatrix} E \\ \sigma \end{bmatrix},$$

wherein $E_p$ is the Young's modulus of the piezoelectric sensing film 21. The amount of electricity per electrode can be defined as:

$$Q = \begin{bmatrix} q^A \\ q^B \end{bmatrix} =$$

$$\int \begin{bmatrix} D_e^A \\ D_e^B \end{bmatrix}^T dA = \int \begin{bmatrix} D_e^A \\ D_e^B \end{bmatrix}_{zx} dA_{31} + \int \begin{bmatrix} D_e^A \\ D_e^B \end{bmatrix}_{yz} dA_{23} + \int \begin{bmatrix} D_e^A \\ D_e^B \end{bmatrix} dA_{12},$$

wherein $A_{31}$ and $A_{23}$ are very small and can be ignored, $A_{12}=wz$. Hence it can be obtained that:

$$Q = \begin{bmatrix} q^A \\ q^B \end{bmatrix} = \begin{bmatrix} D_e^A \\ D_e^B \end{bmatrix} A_{12} = \begin{bmatrix} D_e^A \\ D_e^B \end{bmatrix}(wz) = \begin{bmatrix} d_{13}^A & \varepsilon_f^A \\ d_{13}^B & \varepsilon_t^B \end{bmatrix}$$

$$E_P(wz) = \begin{bmatrix} d_{13}^A \frac{6F_zL}{E_{ct}H_z^3} E_P(wz) \\ d_{13}^B \frac{6F_yL}{E_{ct}H_y^3} E_P(wz) \end{bmatrix} \begin{bmatrix} \hat{K}^A & F_z \\ \hat{K}^B & F_y \end{bmatrix} = C_q,$$

wherein $\hat{K}^A = d_{13}^A \frac{6F_zL}{E_{ct}H_z^3} E_P(wz); \hat{K}^B = d_{13}^B \frac{6F_yL}{E_{ct}H_y^3} E_P(wz),$ $d_{13}^A$ and $d_{13}^B$ are the piezoelectric coefficients of the first electrode A and the second electrode B 61 respectively.

Finally, the tangential force $F_y=C_qV^B/\hat{K}^B$ and the feed force $F_z=C_qV^A/\hat{K}^A$ can be obtained. Thus, when inputting the sensing voltage and other data, the tangential force and the feed force of the operating tool 41' of the turning tool can be obtained.

As can be seen from the above description, the piezoelectric sensing module 20 of the piezoelectric sensing module of the present invention can be applied to the operating tools 41 or 41' of various machine tools 40 to calculate the force applied to the operating tool 41 or 41' by using the piezoelectric sensing signals of the electrodes. The piezoelectric sensing signals of different electrodes can provide various values. For example, the first electrode A and the second electrode B can be used for calculating the feed force and transverse force of the milling tool. The first electrode A and the sixth electrode D2 can be used for calculating the tangential force of the milling tool. The third electrode C1 and the fourth electrode C2 can be used for calculating the torque of the wrench. The first electrode A and the second electrode B can be used for calculating the tangential force and the feed force of the turning tool. However, the present invention is not limited to the above embodiments.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:

1. A piezoelectric sensing module disposed on an operating tool of a machine tool, comprising:
   a piezoelectric sensing film at least comprising:
   a first electrode;
   a second electrode;
   a third electrode;
   a fourth electrode;
   a fifth electrode; and
   a sixth electrode disposed thereon, wherein the first electrode is disposed between the third electrode and the fourth electrode, the second electrode is disposed between the fifth electrode and the sixth electrode; wherein the first and the second electrodes, the third and the fifth electrodes, and the fourth and the sixth electrodes are separated by a certain distance respectively, and when the piezoelectric sensing film is attached to the operating tool, a first angle between the first and the second electrodes, a second angle between the third and the fifth electrodes, and a third angle between the fourth and the sixth electrodes on the operating tool each have an included angle of 90 degrees; wherein the first electrode is polarized in the direction of the third electrode and the fourth electrode, the fifth electrode and the sixth electrode are polarized in the direction of the second electrode, the fifth electrode is polarized in the direction of the third electrode, the sixth electrode is polarized in the direction of the fourth electrode.

2. The piezoelectric sensing module as claimed in claim 1, wherein the operating tool can be a milling tool, the first and the second electrodes are used for calculating a feed force and a transverse force of the operating tool, wherein the feed force and the transverse force are obtained from:

$$F_{xy}^A = F_y \cos(\theta) + F_x \sin(\theta);$$

$$F_{xy}^B = F_y \cos(\theta+90°) + F_x \sin(\theta+90°), \text{ and}$$

$$F_{xy}^A = C_q V^A/K^A, F_{xy}^B = C_q V^B/K^B,$$

$$K^A = d_{13}^A \times LB \times F_{xy}^A, K^B = d_{13}^B \times LD \times F_{xy}^B;$$

wherein $F_x$ is the feed force, $F_y$ is the transverse force, $\theta$ is the rotation angle, $C_q$ is the capacitance, $V^A$ is the measured voltage of the first electrode, $V^B$ is the measured voltage of the second electrode, $LD=-32L/[E_{ct}(\pi D_0^3)]$, $E_{ct}$ is the Young's modulus of the operating tool, $D_0$ is the operating tool diameter, $d_{13}^A$ and $d_{13}^B$; are the piezoelectric coefficients of the first electrode and the second electrode respectively, L is the distance of the first electrode and the second electrode to a cutting end.

3. The piezoelectric sensing module as claimed in claim 2, wherein the first to the sixth electrodes are used for calculating a tangential force of the operating tool, wherein the tangential force is obtained from: $F_t = F_x \sin(\theta) - F_y \cos(\theta)$ and:
   the feed force $$F_x = \frac{1}{2}\sqrt{(\zeta^2 + \eta^2)},$$

the transverse force $$F_y = \frac{1}{2}\sqrt{(\zeta'^2 + \eta'^2)},$$

wherein $$\zeta = \frac{C_q V^A}{K^A} + \frac{JG}{(D_0/2)^2}\operatorname{atan}\left(\frac{\Delta V^C}{k}\right),$$

$$\eta = \frac{C_q V^B}{K^B} + \frac{JG}{(D_0/2)^2}\operatorname{atan}\left(\frac{\Delta V^D}{k}\right),$$

$$\zeta' = \frac{C_q V^A}{K^A} - \frac{JG}{(D_0/2)^2}\operatorname{atan}\left(\frac{\Delta V^C}{k}\right),$$

$$\eta' = \frac{C_q V^B}{K^B} - \frac{JG}{(D_0/2)^2}\operatorname{atan}\left(\frac{\Delta V^D}{k}\right),$$

where $k = \frac{1}{C_q}d_{13}E_P z \Delta l$, J is the polar moment of inertia, G is the modulus of rigidity, $\Delta V^C$ is the voltage difference between the third electrode and the fourth electrode, $\Delta V^D$ is the voltage difference between the fifth electrode and the sixth electrode, $E_p$ is the Young's modulus of the piezoelectric sensing film, $\Delta l$ is the distance between the third electrode and fourth electrode, and also the distance between the fifth electrode and the sixth electrode, $d_{13}$ is the piezoelectric coefficient, z is the length of any electrode.

4. The piezoelectric sensing module as claimed in claim 1, wherein the operating tool can be a pneumatic wrench or an electric wrench, a torque of the operating tool can be calculated according to a voltage difference of a piezoelectric sensing signal between the third electrode and the fourth electrode, or the fifth electrode and the six electrode, wherein the torque is obtained from $$\tau = \frac{JG}{(D_0/2)^2}\operatorname{atan}\left(\frac{\Delta V}{k}\right), \text{ wherein } k = \frac{1}{C_q}d_{13}E_P z \Delta l, J$$

is the polar moment of inertia, G is the modulus of rigidity, $D_0$ is the operating tool diameter, $\Delta V$ is the voltage difference of the third electrode and the fourth electrode or the fifth electrode and the sixth electrode, $C_q$ is the capacitance, $d_{13}$ is the piezoelectric coefficient, $E_p$ is the Young's modulus of the piezoelectric sensing film, $\Delta l$ is the distance between the third electrode and fourth electrode or the fifth electrode and the sixth electrode, z is the length of any electrode.

5. The piezoelectric sensing module as claimed in claim 1, wherein the operating tool can be a turning tool, the first and the second electrodes are used for calculating a tangential force and a feed force of the operating tool, wherein the tangential force and the feed force are obtained from:

$$F_y = C_q V^B / \hat{K}^B, F_z = C_q V^A / \hat{K}^A,$$

wherein $F_y$ is the tangential force, $F_z$ is the feed force, $C_q$ is the capacitance, $V^A$ is the measured voltage of the first electrode, $V_B$ is the measured voltage of the second electrode, $$\hat{K}^A = d_{13}^A \frac{6L}{E_{ct} H_z^3} E_P(wz), \hat{K}^B = d_{13}^B \frac{6L}{E_{ct} H_z^3} E_P(wz),$$

$E_{ct}$ is the Young's modulus of the operating tool, $E_p$ is the Young's modulus of the piezoelectric sensing film, L is the distance of the first electrode and the second electrode to a cutting end, $d_{13}{}^A$ and $d_{13}{}^B$ are the piezoelectric coefficients of the first electrode and the second electrode, z is the length of the electrode, w is the width of the electrode, $H_y$ and $H_z$ are the width and height of the operating tool.

6. The piezoelectric sensing module as claimed in claim 1, wherein the stressed condition of the operating tool can be obtained by using statistical analysis if the first electrode to the sixth electrode are not disposed at angles of 0 degrees and 90 degrees of the operating tool respectively.

7. A piezoelectric sensing module detecting method for a piezoelectric sensing module, wherein the piezoelectric sensing module is disposed on an operating tool of a machine tool to calculate a stress of a cutter unit, the method comprising the steps of:

providing a piezoelectric sensing film;

disposing at least a first electrode, a second electrode, a third electrode, a fourth electrode, a fifth electrode and a sixth electrode on the piezoelectric sensing film;

attaching the piezoelectric sensing film on the cutter unit, so that a first angle between the first and the second electrodes, a second angle between the third and the fifth electrodes, and a third angle between the fourth and the sixth electrodes on the operating tool each have an included angle of 90 degrees;

polarizing the first electrode in the directions of the third electrode and the fourth electrode;

polarizing the fifth electrode and the sixth electrode in the direction of the second electrode;

polarizing the fifth electrode in the direction of the third electrode; and polarizing the sixth electrode in the direction of the fourth electrode.

8. The piezoelectric sensing module detecting method as claimed in claim 7, wherein the operating tool can be a milling tool, the method further comprises the step of using first and the second electrodes for calculating a feed force and a transverse force of the operating tool, wherein the feed force and the transverse force are obtained from:

$$F_{xy}{}^A = F_y \cos(\theta) + F_x \sin(\theta);$$

$$F_{xy}{}^B = F_y \cos(\theta + 90°) + F_x \sin(\theta + 90°), \text{ and}$$

$$F_{xy}{}^A = C_q V^A / K^A, F_{xy}{}^B = C_q V^B / K^B,$$

$$K^A = d_{13}{}^A \times LB \times F_{xy}{}^A, K^B = d_{13}{}^B \times LD \times F_{xy}{}^B;$$

wherein $F_x$ is the feed force, $F_y$ is the transverse force, $\theta$ is the rotation angle, $C_q$ is the capacitance, $V^A$ is the measured voltage of the first electrode, $V^B$ is the measured voltage of the second electrode, $LD = -32L/[E_{ct}(\pi D_0{}^3)]$, $E_{ct}$ is the Young's modulus of the operating tool, $D_0$ is the operating tool diameter, $d_{13}{}^A$ and $d_{13}{}^B$ are the piezoelectric coefficients of the first electrode and the second electrode respectively, L is the distance of the first electrode and the second electrode to a cutting end.

9. The piezoelectric sensing module detecting method as claimed in claim 8 further comprising the step of calculating a tangential force of the operating tool by using the first to the sixth electrodes, wherein the tangential force is obtained from $F_t=F_x \sin(\theta)-F_y \cos(\theta)$, and:
the feed force $$F_x = \frac{1}{2}\sqrt{(\zeta^2 + \eta^2)},$$

the transverse force $$F_y = \frac{1}{2}\sqrt{(\zeta'^2 + \eta'^2)},$$

wherein $$\zeta = \frac{C_q V^A}{K^A} + \frac{JG}{(D_0/2)^2} \mathrm{atan}\left(\frac{\Delta V^C}{k}\right),$$

$$\eta = \frac{C_q V^B}{K^B} + \frac{JG}{(D_0/2)^2} \mathrm{atan}\left(\frac{\Delta V^D}{k}\right),$$

$$\zeta' = \frac{C_q V^A}{K^A} - \frac{JG}{(D_0/2)^2} \mathrm{atan}\left(\frac{\Delta V^C}{k}\right),$$

$$\eta' = \frac{C_q V^B}{K^B} - \frac{JG}{(D_0/2)^2} \mathrm{atan}\left(\frac{\Delta V^D}{k}\right),$$

wherein $k = \frac{1}{C_q} d_{13} E_P z \Delta l$, J is the polar moment of inertia, G is the modulus of rigidity, $\Delta V^C$ is the voltage difference between the third electrode and the fourth electrode, $\Delta V^D$ is the voltage difference between the fifth electrode and the sixth electrode, $E_p$ is the Young's modulus of the piezoelectric sensing film, $\Delta l$ is the distance between the third electrode and fourth electrode, and also the distance between the fifth electrode and the sixth electrode, $d_{13}$ is the piezoelectric coefficient, z is the length of any electrode.

10. The piezoelectric sensing module detecting method as claimed in claim 7, wherein the operating tool can be a pneumatic wrench or an electric wrench, the method further comprises the step of: obtaining a torque of the operating tool according to a voltage difference of a piezoelectric sensing signal between the third electrode and the fourth electrode, or the fifth electrode and the six electrode, wherein the torque is obtained from $$\tau = \frac{JG}{(D_0/2)^2} \mathrm{atan}\left(\frac{\Delta V}{k}\right), \text{ wherein } k = \frac{1}{C_q} d_{13} E_P z \Delta l,$$

is the polar moment of inertia, G is the modulus of rigidity, $D_0$ is the operating tool diameter, $\Delta V$ is the voltage difference of the third electrode and the fourth electrode or the fifth electrode and the sixth electrode, $C_q$ is the capacitance, $d_{13}$ is the piezoelectric coefficient, $E_p$ is the Young's modulus of the piezoelectric sensing film, $\Delta l$ is the distance between the third electrode and fourth electrode or the fifth electrode and the sixth electrode, z is the length of any electrode.

11. The piezoelectric sensing module detecting method as claimed in claim 7, wherein the operating tool can be a turning tool, the method further comprises the step of calculating a tangential force and a feed force of the operating tool by using the first and the second electrodes, wherein the tangential force and the feed force are obtained from:

$$F_y = C_q V^B / \hat{K}^B, F_z = C_q V^A / \hat{K}^A,$$

wherein $F_y$ is the tangential force, $F_z$ is the feed force, $C_q$ is the capacitance, $V^A$ is the measured voltage of the first electrode, $V^B$ is the measured voltage of the second electrode, $$\hat{K}^A = d_{13}^A \frac{6L}{E_{ct} H_z^3} E_P(wz), \hat{K}^B = d_{13}^B \frac{6l}{E_{ct} H_z^3} E_P(wz),$$

$E_{ct}$ is the Young's modulus of the operating tool, $E_p$ is the Young's modulus of the piezoelectric sensing film, L is the distance of the first electrode and the second electrode to a cutting end, $d_{13}^A$ and $d_{13}^B$ are the piezoelectric coefficients of the first electrode and the second electrode, z is the length of the electrode, w is the width of the electrode, $H_y$ and $H_z$ are the width and height of the operating tool.

12. The piezoelectric sensing module detecting method as claimed in claim 7 further comprising:
obtaining the stressed condition of the operating tool by using statistical analysis if the first electrode to the sixth electrode are not disposed at angles of 0 degrees and 90 degrees of the operating tool respectively.

13. A piezoelectric sensing detection system for an operating tool of a machine tool, the piezoelectric sensing detection system comprising:
a piezoelectric sensing module disposed on the operating tool, when the operating tool is operating, the piezoelectric sensing module obtains a piezoelectric sensing signal, wherein the piezoelectric sensing module comprises:
a piezoelectric sensing film at least comprising:
a first electrode;
a second electrode;
a third electrode;
a fourth electrode;
a fifth electrode; and
a sixth electrode disposed thereon, wherein the first electrode is disposed between the third electrode and the fourth electrode, the second electrode is disposed between the fifth electrode and the sixth electrode; wherein the first and the second electrodes, the third and the fifth electrodes, and the fourth and the sixth electrodes are separated by a certain distance respectively, and when the piezoelectric sensing film is attached to the operating tool, a first angle between the first and the second electrodes, a second angle between the third and the fifth electrodes, and a third angle between the fourth and the sixth electrodes on the operating tool each have an included angle of 90 degrees; and
a signal processing module electrically connected with the piezoelectric sensing module to obtain a stressed condition of the operating tool according to the piezoelectric sensing signal; wherein the first electrode is polarized in the direction of the third electrode and the fourth electrode, the fifth electrode and the sixth electrode are polarized in the direction of the second electrode, the fifth electrode is polarized in the direction of the third electrode, the sixth electrode is polarized in the direction of the fourth electrode.

14. The piezoelectric sensing detection system as claimed in claim 13, wherein the operating tool can be a milling tool, the signal processing module calculates a feed force and a transverse force of the operating tool according to piezoelectric sensing signals of the first and the second electrodes, wherein the feed force and the transverse force are obtained from:

$$F_{xy}^A = F_y \cos(\theta) + F_x \sin(\theta);$$

$$F_{xy}^B = F_y \cos(\theta+90°) + F_x \sin(\theta+90°), \text{ and}$$

$$F_{xy}^A = C_q V^A/K^A, F_{xy}^B = C_q V^B/K^B,$$

$$K^A = d_{13}^A \times LB \times F_{xy}^A, K^B = d_{13}^B \times LD \times F_{xy}^B;$$

wherein $F_x$ is the feed force, $F_y$ is the transverse force, $\theta$ is the rotation angle, $C_q$ is the capacitance, $V^A$ is the measured voltage of the first electrode, $V^B$ is the measured voltage of the second electrode, $LD = -32L/[E_{ct}(\pi D_0^3)]$, $E_{ct}$ is the Young's modulus of the operating tool, $D_0$ is the operating tool diameter, $d_{13}^A$ and $d_{13}^B$ are the piezoelectric coefficients of the first electrode and the second electrode respectively, L is the distance of the first electrode and the second electrode to a cutting end.

15. The piezoelectric sensing detection system as claimed in claim 14, wherein the signal processing module calculates a tangential force of the operating tool according to piezoelectric sensing signals of the first to sixth electrodes, wherein the tangential force is obtained from: $F_t = F_x \sin(\theta) - F_y \cos(\theta)$ and:

the feed force $$F_x = \frac{1}{2}\sqrt{(\zeta^2 + \eta^2)},$$

the transverse force $$F_y = \frac{1}{2}\sqrt{(\zeta'^2 + \eta'^2)},$$

wherein $$\zeta = \frac{C_q V^A}{K^A} + \frac{JG}{(D_0/2)^2} \text{atan}\left(\frac{\Delta V^C}{k}\right),$$

$$\eta = \frac{C_q V^B}{K^B} + \frac{JG}{(D_0/2)^2} \text{atan}\left(\frac{\Delta V^D}{k}\right),$$

$$\zeta' = \frac{C_q V^A}{K^A} - \frac{JG}{(D_0/2)^2} \text{atan}\left(\frac{\Delta V^C}{k}\right),$$

$$\eta' = \frac{C_q V^B}{K^B} - \frac{JG}{(D_0/2)^2} \text{atan}\left(\frac{\Delta V^D}{k}\right), \text{ wherein } k = \frac{1}{C_q}d_{13}E_P z \Delta l, J$$

is the polar moment of inertia, G is modulus of rigidity, $\Delta V^C$ is the voltage difference between the third electrode and the fourth electrode, $\Delta V^D$ is the voltage difference between the fifth electrode and the sixth electrode, $E_p$ is the Young's modulus of the piezoelectric sensing film, $\Delta l$ is the distance between the third electrode and fourth electrode, and also the distance between the fifth electrode and the sixth electrode, $d_{13}$ is the piezoelectric coefficient, z is the length of any electrode.

16. The piezoelectric sensing detection system as claimed in claim 13, wherein the operating tool can be a pneumatic wrench or an electric wrench, the signal processing module obtains a torque of the operating tool according to a voltage difference of a piezoelectric sensing signal between the third and fourth electrodes or the fifth electrode and the six electrode:

$$\tau = \frac{JG}{(D_0/2)} \text{atan}\left(\frac{\Delta V}{k}\right), \text{ wherein } k = \frac{1}{C_q}d_{13}E_P z \Delta l, J$$

is the polar moment of inertia, G is the modulus of rigidity, $D_0$ is the operating tool diameter, $\Delta V$ is the voltage difference of the third electrode and the fourth electrode or the fifth electrode and the sixth electrode, $C_q$ is the capacitance, $d_{13}$ is the piezoelectric coefficient, $E_p$ is the Young's modulus of the piezoelectric sensing film, $\Delta l$ is the distance between the third electrode and fourth electrode or the fifth electrode and the sixth electrode, z is the length of any electrode.

17. The piezoelectric sensing detection system as claimed in claim 13, wherein the operating tool can be a turning tool, the signal processing module calculates a tangential force and a feed force of the operating tool according to piezoelectric sensing signals of the first and the second electrodes, wherein the tangential force and the feed force are obtained from:

$$F_y = C_q V^B/\hat{K}^B, F_z = C_q V^A/\hat{K}^A,$$

wherein $F_y$ is the tangential force, $F_z$ is the feed force, $C_q$ is the capacitance, $V^A$ is the measured voltage of the first electrode, $V^B$ is the measured voltage of the second electrode, $$\hat{K}^A = d_{13}^A \frac{6L}{E_{ct}H_z^3} E_P(wz), \hat{K}^B = d_{13}^B \frac{6L}{E_{ct}H_z^3} E_P(wz),$$

$E_{ct}$ is the Young's modulus of the operating tool, $E_p$ is the Young's modulus of the piezoelectric sensing film, L is the distance of the first electrode and the second electrode to a cutting end, $d_{13}^A$ and $d_{13}^B$ are the piezoelectric coefficients of the first electrode and the second electrode, z is the length of the electrode, w is the width of the electrode, $H_y$ and $H_z$ are the width and height of the operating tool.

18. The piezoelectric sensing detection system as claimed in claim 13 further comprising:
a bearing assembly for mounting the cutter unit; and
an antenna module electrically connected to the piezoelectric sensing module for using the reflection of the bearing assembly to transmit the piezoelectric sensing signal to the signal processing module in the vertical direction of the bearing assembly.

19. The piezoelectric sensing detection system as claimed in claim 13, wherein the stressed condition of the operating tool can be obtained by using statistical analysis if the first electrode to the sixth electrode are not disposed at angles of 0 degrees and 90 degrees of the operating tool respectively.

* * * * *